United States Patent [19]
Cimini, Jr. et al.

[11] Patent Number: 5,091,916
[45] Date of Patent: Feb. 25, 1992

[54] DISTRIBUTED REFLECTOR LASER HAVING IMPROVED SIDE MODE SUPPRESSION

[75] Inventors: Leonard J. Cimini, Jr., Howell; Isam M. I. Habbab, Old Bridge, both of N.J.

[73] Assignee: AT&T Bell Laboratories, Murray Hill, N.J.

[21] Appl. No.: 590,201

[22] Filed: Sep. 28, 1990

[51] Int. Cl.$^5$ .................... H01S 3/098; H01S 3/19
[52] U.S. Cl. .......................... 372/96; 372/19; 372/50
[58] Field of Search ............... 372/20, 50, 96, 19

[56] References Cited

U.S. PATENT DOCUMENTS

| | | | |
|---|---|---|---|
| 3,884,549 | 5/1975 | Wang et al. | 350/96 WG |
| 4,665,528 | 5/1987 | Chinone et al. | 372/96 |
| 4,687,286 | 8/1987 | Winful | 350/96.19 |
| 4,719,636 | 1/1988 | Yamaguchi | 372/50 |
| 4,786,132 | 11/1988 | Gordon | 372/20 |
| 4,852,108 | 7/1989 | Utaka et al. | 372/20 |
| 4,873,691 | 10/1989 | Uomi et al. | 372/20 |
| 4,995,048 | 2/1991 | Kuindersma et al. | 372/50 |
| 5,022,038 | 6/1991 | Bradley | 372/50 |

OTHER PUBLICATIONS

K. O. Hill, Applied Optics, vol. 13, No. 8, Aug. 1974, "Aperiodic Distributed-Parameter Waveguides ... ", pp. 1853–1856.
M. Matsuhara et al., J. of the Optical Soc. of America, vol. 65, No. 7, Jul. 1975, "Optical-waveguide filters: ... ", pp. 804–809.
L. D. Westbrook et al., Elec. Lett., vol. 19, No. 25/26, Dec. 8, 1983, "New Diffraction Grating Profiles ... ", pp. 1076–1077.
X. Pan et al., IEEE J. Quantum Elec., vol. 24, No. 12, Dec. 1988, "A Theoretical Model of Multielectrode ... ", pp. 2423–2432.

Primary Examiner—James W. Davie
Attorney, Agent, or Firm—Gregory C. Ranieri

[57] ABSTRACT

Improved side mode suppression with significantly reduced side mode suppression ratio fluctuation during laser tuning is realized in a distributed Bragg reflector laser structure by incorporating at least one reflector element which exhibits an asymmetric reflection characteristic versus wavelength over a band of wavelengths wide enough to include at least two longitudinal modes of the laser. That is, the asymmetric characteristic is wider than the mode separation for adjacent longitudinal modes of the laser. In one embodiment, a distributed Bragg reflector laser is shown wherein the Bragg reflector includes a corrugated waveguides with corrugations having a period which varies nonlinearly from $\Lambda_O$ at one end of the reflector to $\Lambda hd L$ at the opposite end of the reflector, where $\Lambda_O$ is greater than $\Lambda_L$. Integrated and extended cavity or hybrid structures are described in both semiconductor and fiber laser structures.

12 Claims, 4 Drawing Sheets

DISTRIBUTED REFLECTOR LASER HAVING IMPROVED SIDE MODE SUPPRESSION

TECHNICAL FIELD

This invention relates to lasers and, more particularly, to nominally single longitudinal mode lasers.

BACKGROUND OF THE INVENTION

Lightwave communication systems are presently designed with a requirement for lasers which have the desirable characteristics of limited wavelength tunability and single longitudinal mode operation. For a laser to be considered operating nominally in a single longitudinal mode, it is understood that the side longitudinal modes show a degree of suppression to a substantially insignificant power level relative to the main longitudinal mode emitted by the laser. The ratio of main longitudinal mode power to side longitudinal mode power is termed side mode suppression ratio or, less frequently, sub-mode suppression ratio and and is abbreviated SMSR in most technical articles.

At the present time, it is not unusual for distributed Bragg reflector (DBR) lasers and distributed feedback (DFB) lasers to have a side mode suppression ratio specified as exceeding 30 dB. However, it is important to note that the side mode suppression ratio is specified for laser operation at a particular wavelength. When the laser is tuned to a different operating wavelength, it is shown that the side mode suppression ratio changes. See, for example, *IEEE J. of Quant. Electron.*, Vol. QE-24, No. 12, pp. 2423-32 (1988). Single mode lasers such as semiconductor DFB and DBR lasers, for example, exhibit acceptable side mode suppression at certain wavelengths away from the particularly specified wavelength but unacceptable side mode suppression when tuned to other wavelengths away from the particularly specified wavelength. One reason that the side mode suppression is compromised at the latter wavelengths during tuning is that the relative net threshold gain required for each mode varies with wavelength as the laser is tuned. When the main longitudinal mode of the laser is centered within the reflection characteristic for the resonant cavity of the laser, side mode suppression is usually optimized at a maximum value. For DBR lasers, this centering corresponds to positioning the photoluminescence wavelength at the Bragg wavelength. As the laser is tuned away from the optimum position for maximum side mode suppression, one of the side longitudinal modes is moved closer to a center position of the reflection characteristic. Since the reflection characteristics and the related net threshold gain characteristics are substantially symmetric about a central position, a condition may arise during tuning wherein both longitudinal modes near the central position in the reflectivity characteristic experience substantially the same degree of reflectivity. That is, both modes are situated at substantially equal reflectivities which occur on opposite sides of the symmetric reflection characteristic. When this condition occurs, both modes require substantially equal amounts of net threshold gain. As a result, side mode suppression is considerably degraded and the side mode suppression ratio is rapidly reduced. In our simulations with DBR lasers, for example, a small tuning change has been shown to cause a 10 dB to 20 dB drop in the side mode suppression ratio.

For production semiconductor lasers, severe fluctuations of the side mode suppression ratio during tuning pose a significant problem. A batch of lasers fabricated on the same wafer are known to have different operational characteristics. Usually such related lasers require tuning to some degree to cause them to emit light at the same wavelength. From the problems associated with tuning described above, it is expected that side mode suppression for lasers in the same batch will be different and degraded when all the lasers are tuned to operate at the same wavelength.

SUMMARY OF THE INVENTION

Improved side mode suppression with significantly reduced side mode suppression ratio fluctuation during laser tuning is realized in a distributed Bragg reflector laser structure in accordance principles of the invention by incorporating at least one reflector element which exhibits an asymmetric reflection characteristic versus wavelength over a band of wavelengths wide enough to include at least two longitudinal modes of the laser. That is, the asymmetric characteristic is wider than the mode separation for adjacent longitudinal modes of the laser.

In one embodiment, a distributed Bragg reflector laser is shown wherein the Bragg reflector includes a corrugated waveguides with corrugations having a period which varies nonlinearly from $\Lambda_O$ at one end of the reflector to $\Lambda_L$ at the opposite end of the reflector, where $\Lambda_O$ is greater than $\Lambda_L$. Integrated and extended cavity or hybrid structures are described in both semiconductor and fiber laser structures.

BRIEF DESCRIPTION OF THE DRAWING

A more complete understanding of the invention may be obtained by reading the following description of a specific illustrative embodiment of the invention in conjunction with the appended drawing in which.

Devices and structures shown in the figures have been drawn intentionally not to scale in order to improve the clarity and understanding of the devices and structures shown. Exemplary dimensions, if necessary, have been provided in the specification.

DETAILED DESCRIPTION

The present invention is applicable to lasers which include at least one diffraction grating acting as an end reflector element for the laser cavity. It will become apparent to those persons skilled in the art that the practice of the invention encompasses more than the semiconductor embodiment shown in the figures described below. For example, it is contemplated that the invention may be realized in a hybrid structure such as a silicon chip Bragg reflector laser wherein the external element including the diffraction grating is butt-coupled to the gain medium. Also, it is contemplated that the invention may be realized in a hybrid semiconductor-fiber structure wherein the diffraction grating is written on the optical fiber. Finally, it is contemplated that the invention may be realized in a fiber laser structure where again the diffraction grating is written on a portion of the optical fiber.

In order to understand more fully the benefits of the present invention, it is instructive to review a standard DBR laser structure. The side mode suppression performance of the standard DBR laser will be compared with the side mode suppression performance of the laser realized in accordance with the principles of this invention.

Figure 1:
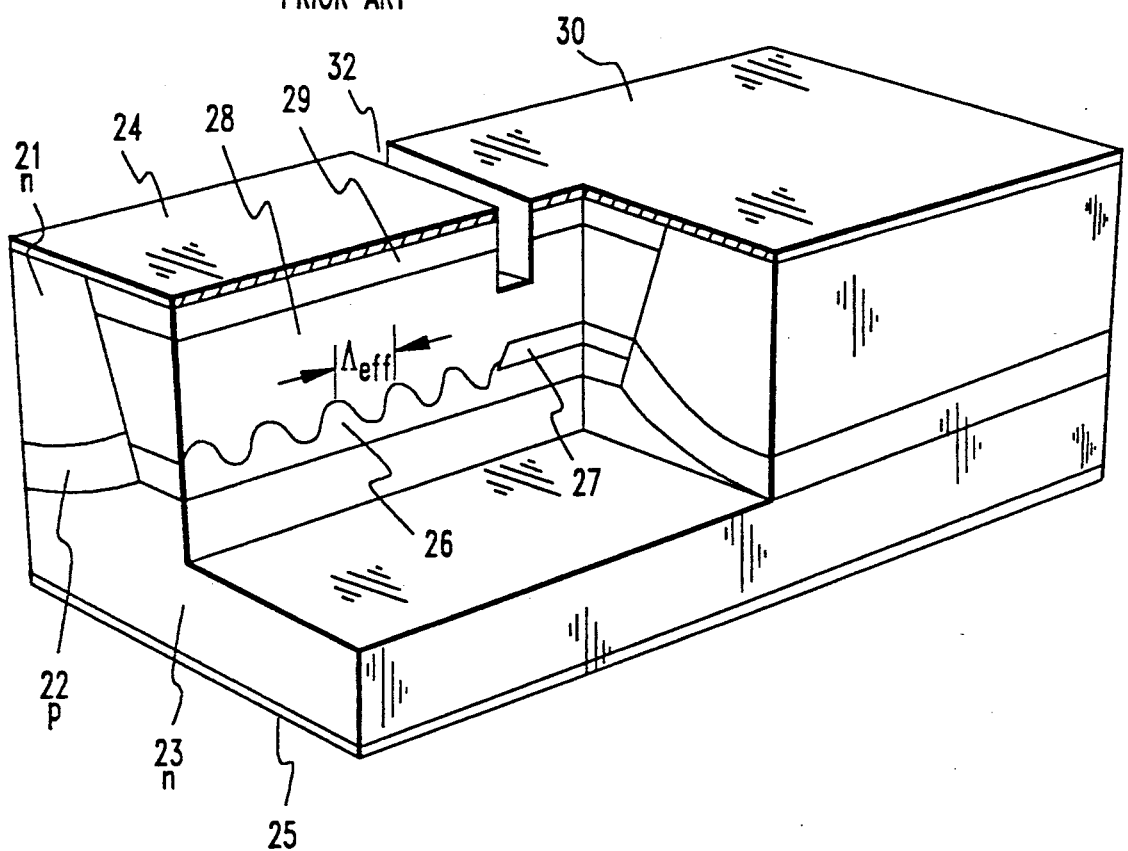
FIG. 1 shows a cutaway view of a semiconductor distributed Bragg reflector laser known in the prior art.
Figure 2:
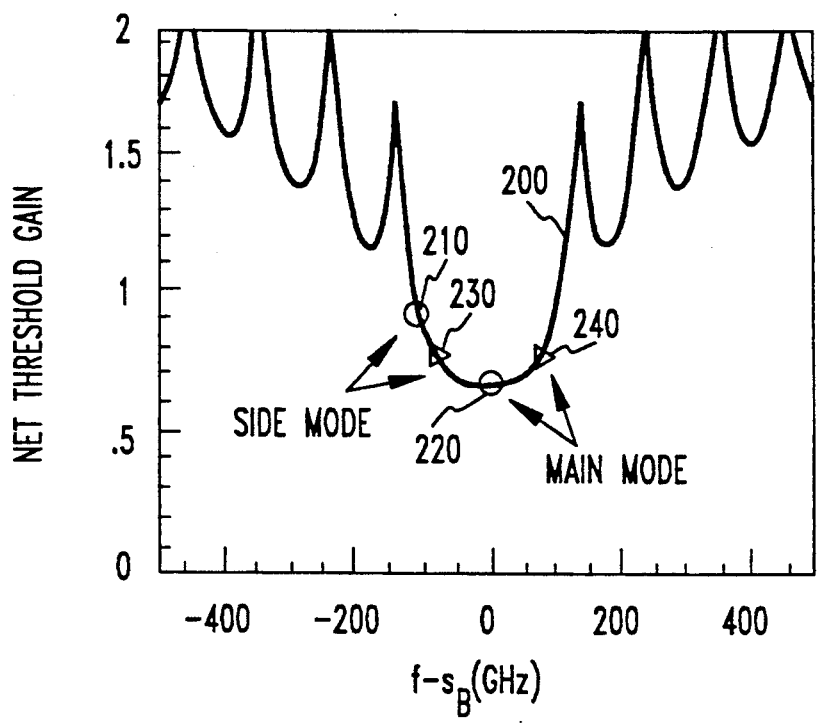
FIG. 2 shows a plot of net threshold gain versus relative frequency for a standard DBR laser as shown in FIG. 1.

FIG. 1 shows a perspective cross-section and cutaway view of an exemplary distributed Bragg reflector semiconductor laser for use as a standard DBR laser. The DBR laser shown in FIG. 2 is a buried heterostructure having a reversed-bias p-n blocking region. Other structures such as buried ridge, crescent or V-groove, double channel planar buried heterostructure, semi-insulating blocking region planar buried heterostructure and the like are contemplated for use as embodiments of the DBR laser.

Semiconductor structures such as the one shown in FIG. 1 are grown using epitaxial growth techniques such as liquid phase epitaxy, molecular beam epitaxy, chemical beam epitaxy and vapor phase epitaxy. These techniques are described in the literature and are well known to those skilled in the art. See, for example, H. C. Casey, et al., *Heterostructure Lasers*, Vols. A and B. Academic Press (1978). Also see U.S. Pat. No. 4,023,993 for a description of a method for making a distributed feedback laser which is similar to the laser heterostructure in FIG. 1.

As shown in FIG. 1, the DBR laser includes an n-type Sn:InP substrate 23 on which the reversed-bias p-n blocking region and the buried heterostructure are grown. Contact layers 24, 30 and 25 are shown as broad area metallic contacts deposited on top and bottom (contact 25) surfaces of the DBR laser for biasing and current injection. Current injection is optional for the Bragg reflector region via contact 24. Standard ohmic contact fabrication techniques such as multi-layer evaporation of metal films, alloy evaporation, sputtering and annealing may be employed to realize the ohmic contacts for the particular DBR laser. In the laser shown in FIG. 1, contacts 24 and 30 are standard Au-Zn contacts whereas contact 25 is an evaporated Au-Ge-Ni contact.

Frequency tuning of this semiconductor laser is accomplished through contact 24. Current injected into this region determines the carrier density which, in turn, determines the index of refraction for the material comprising the Bragg reflector. At a higher carrier density, the refractive index decreases and the transmission peak shifts towards shorter wavelengths.

Using standard epitaxial growth techniques, a heterostructure is grown on substrate 23 in the following order: an additional n-type Sn:InP buffer layer (not shown) approximately 1 μm thick; an n-type guide layer 26 comprising $Sn:In_xGa_{1-x}As_yP_{1-y}$ approximately 0.3 μm thick and having suitable mole fractions x, y for approximately 1.3 μm; approximately 1 μm thick; an undoped quaternary $(In_xGa_{1-x}As_yP_{1-y})$ active layer 27 approximately 0.1 μm thick and having suitable mole fractions x and y to produce a characteristic wavelength $\lambda_p$ substantially at a peak of the gain profile curve as desired-in this example, the characteristic wavelength is selected to be approximately 1.51 μm; and p-type quaternary cap layer 29 approximately 0.7 μm thick. Standard stripe masking using photolithography and etching techniques (for example, bromine methanol etch) are employed to produce the heterostructure mesa.

An intermediate step in the process is to remove a portion of the active layer 27 from the Bragg reflector region and to place a corrugation, for example, on the surface of layer 26 in the Bragg reflector region using standard masking and etching techniques.

After the heterostructure mesa is formed, successive growth steps for p-blocking layer 22 and n-blocking layer 21 are performed over the substrate 25. Blocking layer 22 comprises Zn:InP approximately 0.5 μm thick and blocking layer 21 comprises Sn:In:P to a thickness sufficient to substantially planarize the entire semiconductor structure for contacting.

It is understood that isolation groove 32 is formed by etching, for example, a portion of the heterostructure to create electrical isolation between the Bragg reflector region and the gain region. Other techniques such as ion implantation and the like are contemplated for use in place of the isolation groove 32.

It is understood that dopant concentrations of approximately $10^{17}$ to $10^{18}$ cm$^{-3}$ are suitable for the Sn and Zn dopants int he layers of the DBR laser described above. After final preparation, the laser is cleaved to produce at least two end facets in planes perpendicular to a direction of light propagation supported in the heterostructure. Since the laser shown has a corrugation grating as the integrated feedback structure between the facets, it is generally acceptable practice to apply anti-reflection coatings to the at least two end facets to reduce end facet reflections to a minimum.

The feedback structure of the DBR laser includes a corrugation grating 31 which is formed in guide layer 26. Shade, depth and pitch or period of the grating are variable and depend on the grating placement together with the result desired therefrom. In principle, the feedback structure of the DBR laser includes spatially periodic perturbations in the transmission characteristics of the laser waveguide formed substantially continuously along the direction of lightwave propagation in the laser waveguide and substantially transverse to the propagation direction of optical energy in the waveguide. Spatially periodic perturbations of the transmission characteristics of the waveguide may take the form of variations in gain, index of refraction, propagation constant, or other parameter of the waveguide medium for the laser.

For a DBR laser as shown in FIG. 1, net threshold gain may be characterized as shown in FIG. 2. The net threshold gain (curve 200) is plotted versus relative frequency where relative frequency is determined as the detuning from the Bragg frequency of diffraction grating 31. The net threshold gain is a symmetric function. It is understood by those skilled in the art that the reflectivity for the laser may be derived from the net threshold gain. From such a derivation, it is apparent that the reflectivity retains all the symmetries of the net threshold gain function. See, for example, *IEEE J. Quant. Electron.*, Vol. 24 No. 12, pp. 2423-32 (1988).

On curve 200, points 210 to 240 have been plotted to show the approximate motion of two adjacent modes of the laser when the diffraction grating is being tuned via electrode 24. At a first tuning position, the net threshold gain required by the main mode is shown at point 220 whereas the net threshold gain required by the side mode is shown at point 210. Since the difference in net threshold gains between points 210 and 220 is significant, the laser will exhibit an acceptable side mode suppression ratio. As the diffraction grating is tuned away from the first tuning position, the location of the main mode is moved to point 240 on the net threshold gain curve whereas the location of the adjacent side mode is moved to point 230. The difference in net threshold gains for two modes in this tuning position is insubstantial. It is expected that in this tuning position the laser will exhibit degraded side mode suppression performance.

Figure 3:
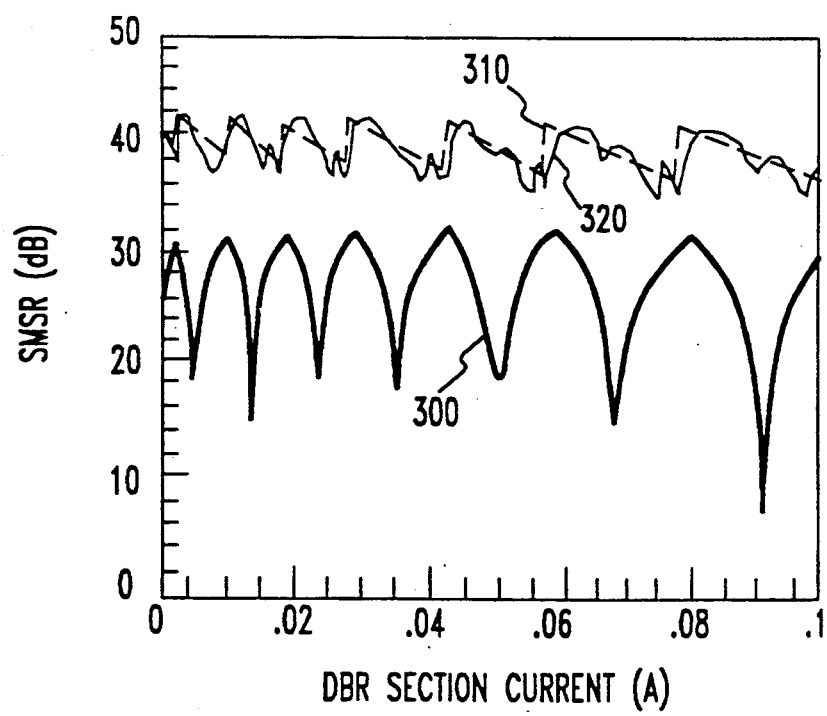
FIG. 3 shows side mode suppression ratio curves versus tuning current for the prior art laser of FIG. 1 in comparison with the lasers realized in accordance with the principles of the invention.

The side mode suppression performance for the laser shown in FIG. 1 whose net threshold gain is characterized in FIG. 2 is shown in curve 300 of FIG. 3 as a function of the tuning current applied to the diffraction grating (Bragg reflector) section of the laser. Degradation of the side mode suppression ratio for the standard DBR laser of FIG. 1 varies over a 10 dB to 20 dB range. As it is now understood by us, this degradation results from the symmetries present for the reflectivity of the laser.

Figure 4:
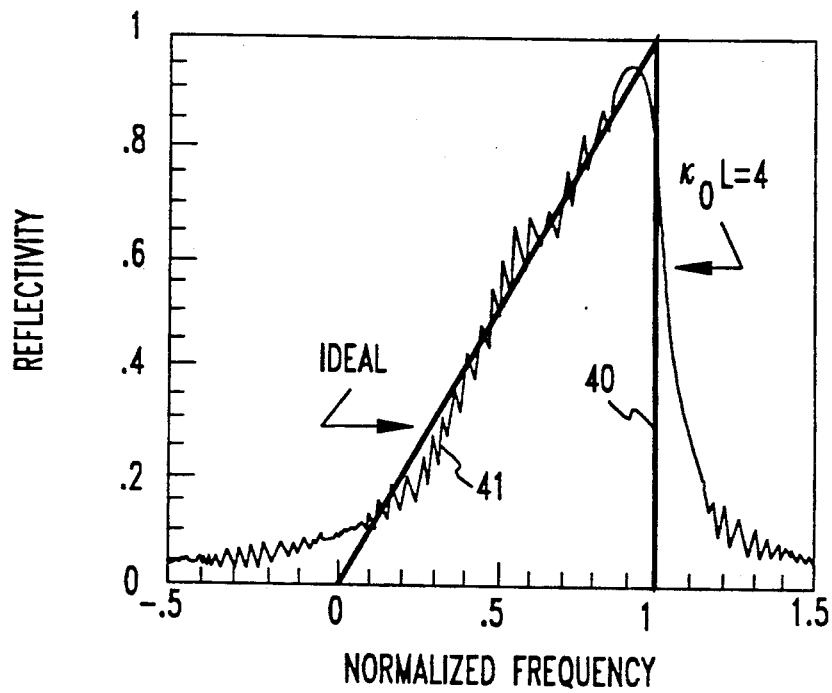
FIG. 4 shows a graph of reflectivity versus normalized frequency for a laser structure shown in FIG. 6 incorporating a grating structure having a strongly asymmetric reflectivity characteristic.
Figure 5:
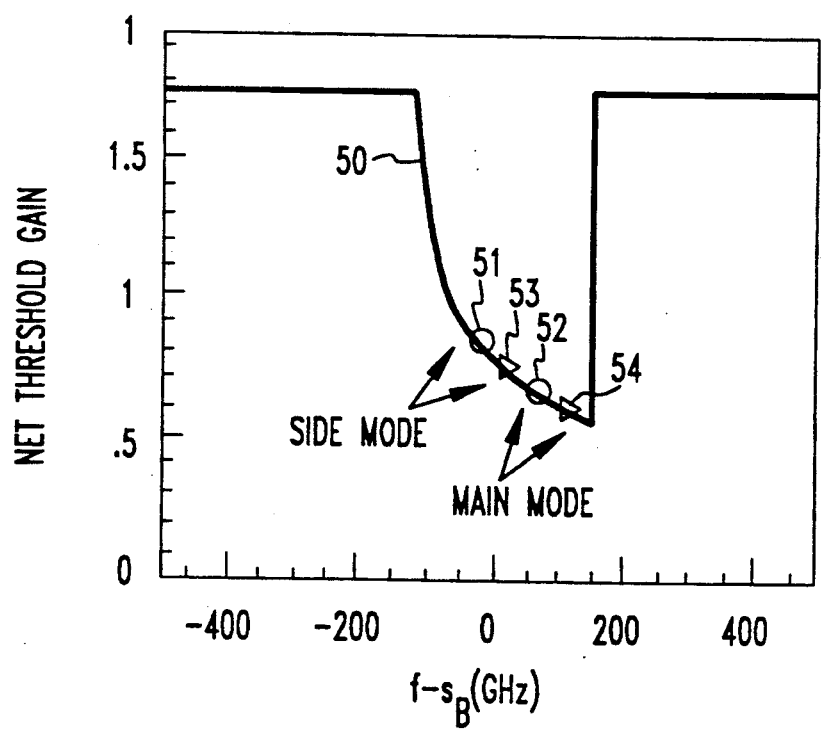
FIG. 5 shows a graph of net threshold gain versus relative frequency for a laser incorporating a grating having reflectivity characteristics shown in FIG. 4.

In order to improve the side mode suppression performance of the laser and reduce fluctuations of the side mode suppression ratio as the laser is tuned, it is necessary to realize the diffraction grating for the laser as one which exhibits a strongly asymmetric reflectivity. Exemplary asymmetric reflectivities are shown in FIG. 4. The asymmetries are an ideal triangular function shown as curve 40 and an approximate triangular function shown as curve 41. One diffraction grating which approximates the triangular function is shown as profile 81 in FIG. 8 wherein the grating pitch varies nonlinearly from a large pitch $\Lambda_0$ to a smaller pitch $\Lambda_L$. As shown in FIG. 4, the normalized coupling coefficient $\kappa_0 L$ is approximately equal to four whose diffraction grating reflectivity is shown as curve 41. As the normalized coupling coefficient is increased, the reflectivity for the grating in curve 41 more closely approximates the reflectivity for the ideal grating in curve 40. The reflectivity curves in FIG. 4 are plotted versus normalized frequency for ease and generality of representation. As will be seen from FIG. 5, the frequency range covered by the diffraction grating represented in FIG. 4 is on the order of 300 GHz.

In order to understand more clearly the improved side mode suppression performance of a laser incorporating a diffraction grating having a strongly asymmetric reflectivity, it is instructive to view the change in relative net threshold gain for the main longitudinal mode and adjacent side mode during tuning of the laser. Net threshold gain is plotted versus relative frequency as curve 50 in FIG. 5. Curve 50 corresponds to the net threshold gain for a laser incorporating a diffraction grating whose reflectivity is the ideal triangular reflectivity shown in curve 40. When the laser is initially tuned, the main mode has a net threshold gain shown as point 52 whereas the adjacent side mode has a net threshold gain shown as point 51. As the diffraction grating is further tuned, the net threshold gain for the main mode appears as point 54 whereas the net threshold gain for the side mode appears as point 53. For both of these tuning conditions, the side mode suppression ratios are substantially equal. As the laser undergoes further tuning, the main mode will reach the sharp cut off at about 150 GHz and experience a sudden large increase in required net threshold gain. In this condition, the original main mode ceases to lase and the adjacent side mode becomes the new main mode or lasing mode. It is understood by those skilled in the art that, when this condition occurs, the laser outputs light at the wavelength of the original side mode rather than at the wavelength of the original main mode.

Referring back to FIG. 3, it is clear that the introduction of a strong asymmetric reflectivity in the diffraction grating of the laser improves the side mode suppression performance of the laser. As shown in FIG. 3, the side mode suppression ratio is plotted versus tuning current for a diffraction grating having the ideal triangular reflectivity (curve 310) and for a diffraction grating having an approximate triangular reflectivity (curve 320). In comparison with the standard DBR laser, the side mode suppression ratio for an exemplary laser realized in accordance with the principles of the invention is not only larger but also exhibits reduced fluctuations. The side mode suppression ratios shown in curves 310 and 320 appear more tightly confined to have fluctuations over an approximately 6 dB range as opposed to the 10 to 20 dB range exhibited for the standard DBR laser. It is now known that, for an exponential type of nonlinear reflectivity for the diffraction grating of the laser, it is possible to achieve a side mode suppression ratio which is substantially constant over the tuning range of the laser.

Figure 7:
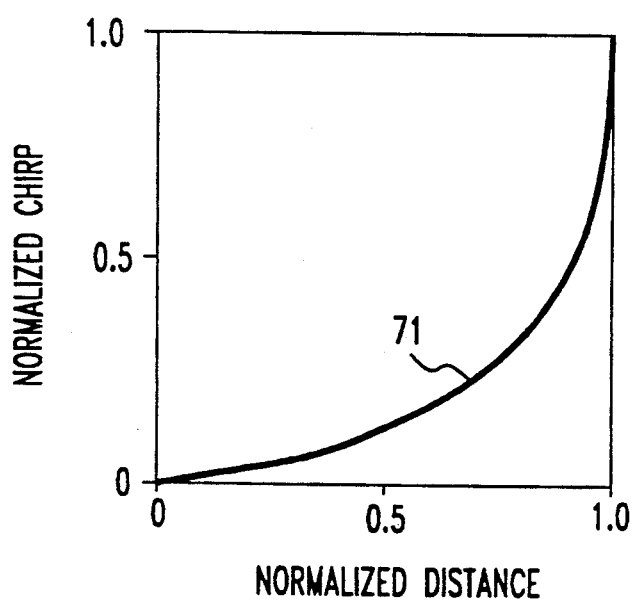
FIG. 7 shows a graph of normalized chirp versus normalized distance for a diffraction grating structure having the reflectivity shown in FIG. 4.
Figure 8:
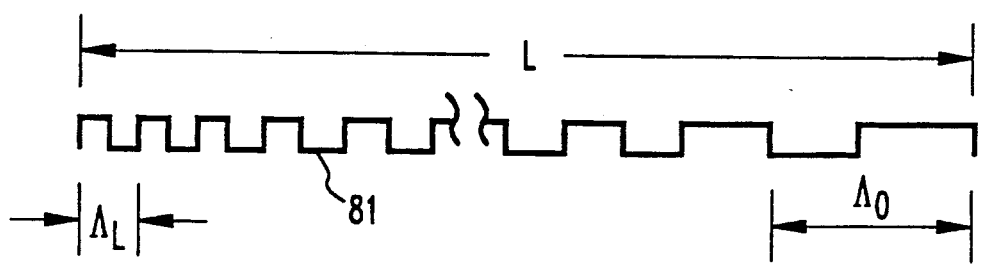
FIG. 8 shows a profile of the diffraction grating structure realized in accordance with the principles of the invention.

As stated above, an exemplary grating profile of length L which embodies the principles of this invention is shown in FIG. 8. Profile 81 shows the use of rectangular corrugations to realize the diffraction grating wherein the pitch varies nonlinearly from one end of the grating to the other end. The nonlinear variation is taken from a large value $\Lambda_0$ at one end to a smaller value $\Lambda_L$ at the other end. The nonlinear variation of the pitch is determined from curve 71 shown in FIG. 7. In order to determine the pitch from curve 71, it is necessary to perform the following calculation.

$$\frac{\Lambda_z}{\Lambda_L} = \frac{\lambda_0 + \Delta\lambda}{\lambda_0 + x\Delta\lambda},$$

where $\Lambda_z$ is the pitch at location z in the grating for $z=0, \ldots, L$; $\Delta\lambda$ is the bandwidth of the reflectivity characteristic; $\lambda_0$ is the lowest wavelength in the bandwidth; and x is the normalized chirp shown in FIG. 7. The normalized length shown in FIG. 7 is determined as z/L. See, for example, *J. of the Optical Soc. of America*, Vol. 65, No. 7, pp. 804-9 (1975).

Figure 6:
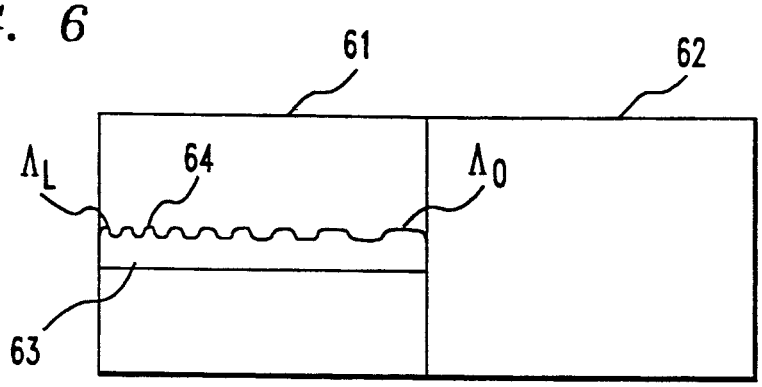
FIG. 6 shows a schematic diagram for a generalized laser structure including a grating having a strongly asymmetric reflectivity characteristic.

A simplified distributed reflector laser structure realized in accordance with the principles of the invention is shown in FIG. 6. The laser includes an external region 61 optically coupled to an active region 62. Both regions include waveguides which are coupled together. A resonant optical cavity is formed between a diffraction grating in external region 61 and the remote end of region 62. The active region comprises one of any number of different gain media such as a semiconductor laser, a solid state laser, or a doped fiber laser. In external region 61, diffraction grating 64 is optically coupled to external waveguide region 63. In accordance with the principles of this invention, diffraction grating 64 exhibits a strong asymmetry in its reflectivity characteristics. As shown in FIG. 6, one exemplary embodiment for the diffraction grating includes a plurality of corrugations with a period which varies nonlinearly from a large pitch $\Lambda_o$ at one end of the grating to a smaller pitch $\Lambda_L$ at an opposite end the grating. It is contemplated that the bandwidth $\Delta\lambda$ of the grating is sufficiently wide to include at least two longitudinal modes of the laser. The asymmetric reflectivity characteristic is designed to substantially eliminate conditions where two or more longitudinal modes require substantially equal net threshold gains. The external region comprises the diffraction grating formed in any number of different media including optical fiber, dielectric material such as silicon-based dielectrics, and semiconductor material. The overall structure of the laser shown in FIG. 6 may be either integrated monolithically on a single substrate or hybrid.

While tuning of the laser has been described for semiconductor material, it is understood by those skilled in the art that piezoelectric materials may be used with appropriate control elements to cause optical path length changes in the optical fiber to which the piezoelectric material is attached. See, for example, U.S. Pat. No. 4,830,451. It is well understood by those skilled in the art that diffraction gratings may be etched or formed directly into the cladding or core region of an optical fiber. Such gratings are shown in U.S. Pat. No. 4,955,028. While it may be desirable to etch a grating directly into the optical fiber, it is contemplated that gratings formed on a plate held in close contact with the exposed core of a fiber will be useful in realizing the invention.

In the description above, the nonlinear functions have been shown to be substantially continuous functions. It is contemplated that these nonlinear functions may be achieved by using piecewise linear segments where the segments display substantially similar monotonically increasing slopes which approximates the nonlinearity.

It is contemplated that first or higher order grating structures may be utilized. Such gratings may be fabricated using standard electron beam, photolithographic, and holographic patterning techniques together with any wet or dry etching techniques. While both sinusoidal and rectangular grating profiles have been shown, triangular, trapezoidal, semicircular or other known complex functions may be useful for the grating profile.

Positioning of the grating with respect to the external waveguide can be varied so that the grating is above or below the waveguide. Of course, grating coupling strength must be considered when selecting a grating position because grating coupling strength is determined by grating position vis-a-vis the waveguide mode, the gating or corrugation depth measured from peak to trough, and the difference between refractive indices for the materials bounding the corrugation or grating.

We claim:

1. A laser comprising an active part having a guided gain region having first and second ends, and an external region having an external waveguide and a diffraction grating optically coupled to the external waveguide, the external region optically coupled to the first end of the guided gain region, and a resonant optical cavity formed between the diffraction grating and the second end of the guided gain region, wherein the improvement comprises the diffraction grating having a plurality of corrugations with a period which varies nonlinearly from $\Lambda_o$ at one end of the grating to $\Lambda_L$ at an opposite end of the grating so that the diffraction grating exhibits an asymmetric reflection characteristic with respect to wavelength, where $\Lambda_o$ is greater than $\Lambda_L$.

2. The laser as defined in claim 1 wherein the external waveguide comprises a plurality of semiconductor material layers.

3. The laser as defined in claim 2 wherein the external region includes means for applying a bias current through a portion of said external region to change an index of refraction for the external region.

4. The laser as defined in claim 3 wherein the plurality of corrugations varies nonlinearly with a period substantially equal to $\Lambda_z$ where $$\Lambda_z = \Lambda_L \frac{\lambda_0 + \Delta\lambda}{\lambda_0 + x\Delta\lambda}$$

for $\Lambda_z$ as the pitch at a position z in the grating for $z=0, \ldots L$; $\Delta\lambda$ is the bandwidth of the reflectivity characteristic; $\lambda_o$ is the lowest wavelength in the bandwidth; and x is normalized chirp defined between 0 and 1, inclusively, as a substantially exponential function of normalized distance z/L, L being the length of diffraction grating.

5. The laser as defined in claim 3 wherein the diffraction grating provides reflection over a range of wavelengths which is greater than or equal to a minimum mode separation for the laser.

6. The laser as defined in claim 1 wherein the external waveguide comprises a plurality of dielectric material layers.

7. The laser as defined in claim 6 wherein the plurality of corrugations varies nonlinearly with a period substantially equal to $\Lambda_z$ where $$\Lambda_z = \Lambda_L \frac{\lambda_0 + \Delta\lambda}{\lambda_0 + x\Delta\lambda}$$

for $\Lambda_z$ as the pitch at a position z in the grating for $z=0, \ldots L$; $\Delta\lambda$ is the bandwidth of the reflectivity characteristic; $\lambda_o$ is the lowest wavelength in the bandwidth; and x is normalized chirp defined between 0 and 1, inclusively, as a substantially exponential function of normalized distance z/L, L being the length of diffraction grating.

8. The laser as defined in claim 6 wherein the diffraction grating provides reflection over a range of wavelengths which is greater than or equal to a minimum mode separation for the laser.

9. The laser as defined in claim 1 wherein the external waveguide comprises an optical fiber.

10. The laser as defined in claim 9 wherein the external region includes means for controlling the length of said optical fiber.

11. The laser as defined in claim 10 wherein the plurality of corrugations varies nonlinearly with a period substantially equal to $\Lambda_z$ where $$\Lambda_z = \Lambda_L \frac{\lambda_0 + \Delta\lambda}{\lambda_0 + x\Delta\lambda}$$

for $\Lambda_z$ as the pitch at a position z in the grating for $z=0, \ldots L$; $\Delta\lambda$ is the bandwidth of the reflectivity characteristic; $\lambda_o$ is the lowest wavelength in the bandwidth; and x is normalized chirp defined between 0 and 1, inclusively, as a substantially exponential function of normalized distance z/L, L being the length of diffraction grating.

12. The laser as defined in claim 10 wherein the diffraction grating provides reflection over a range of wavelengths which is greater than or equal to a minimum mode separation for the laser.

* * * * *